United States Patent [19]

Ajit

[11] Patent Number: 5,581,100

[45] Date of Patent: Dec. 3, 1996

[54] TRENCH DEPLETION MOSFET

[75] Inventor: Janardhanan S. Ajit, Redondo Beach, Calif.

[73] Assignee: International Rectifier Corporation, El Segundo, Calif.

[21] Appl. No.: 298,462

[22] Filed: Aug. 30, 1994

[51] Int. Cl.⁶ .................. H01L 29/94; H01L 31/062; H01L 31/113; H01L 29/76
[52] U.S. Cl. .................. 257/331; 257/341; 257/342; 257/343; 257/403; 257/339
[58] Field of Search .................................. 257/330, 329, 257/331, 339, 341, 342, 343, 401, 403, 132, 133, 139, 140, 146, 147, 155

[56] References Cited

U.S. PATENT DOCUMENTS

| | | | |
|---|---|---|---|
| 4,811,063 | 3/1989 | Valeri et al. | 257/330 |
| 4,903,189 | 2/1990 | Ngo et al. | 257/331 |
| 4,941,026 | 7/1990 | Temple | 257/333 |
| 5,304,821 | 4/1994 | Hagino | 257/133 |
| 5,309,002 | 5/1994 | Terashima | 257/331 |
| 5,323,040 | 6/1994 | Baliga | 257/332 |
| 5,329,142 | 7/1994 | Kitagawa et al. | 257/401 |
| 5,430,315 | 7/1995 | Rumennik | 257/331 |

OTHER PUBLICATIONS

Baliga, B. Jayant, et al., *IEEE Electron Device Letters*, "The Accumulation–Mode Field–Effect Transistor: A New Ultralow On–Resistance MOSFET", vol. 13, No. 8, Aug. 1992, pp. 427–429.

Syau, Tsengyou, et al., *IEEE Transactions on Electron Devices*, "Comparison of Ultralow Specfic On–Resistance UMOSFET Structures: The ACCUFET, EXTFET, INVFET, and Conventional UMOSFET's", vol. 41, No. 5, May 1994, pp. 800–808.

*Primary Examiner*—Steven H. Loke
*Attorney, Agent, or Firm*—Ostrolend, Faber, Gerb & Soffen, LLP

[57] ABSTRACT

A vertical trench power MOS transistor with low on-resistance is obtained by eliminating the inversion region of a conventional structure. In one embodiment, a deep-depletion region is formed between the trench gates to provide forward blocking capability. In another embodiment, forward blocking is achieved by depletion from the trench gates and a junction depletion from a P diffusion between the gates. Both embodiments are preferably fabricated in a cellular geometry. The device may also be provided in a horizontal conduction configuration in which the MOS gate is disposed on the upper surface of the semiconductor wafer over the deep-depletion region.

20 Claims, 10 Drawing Sheets

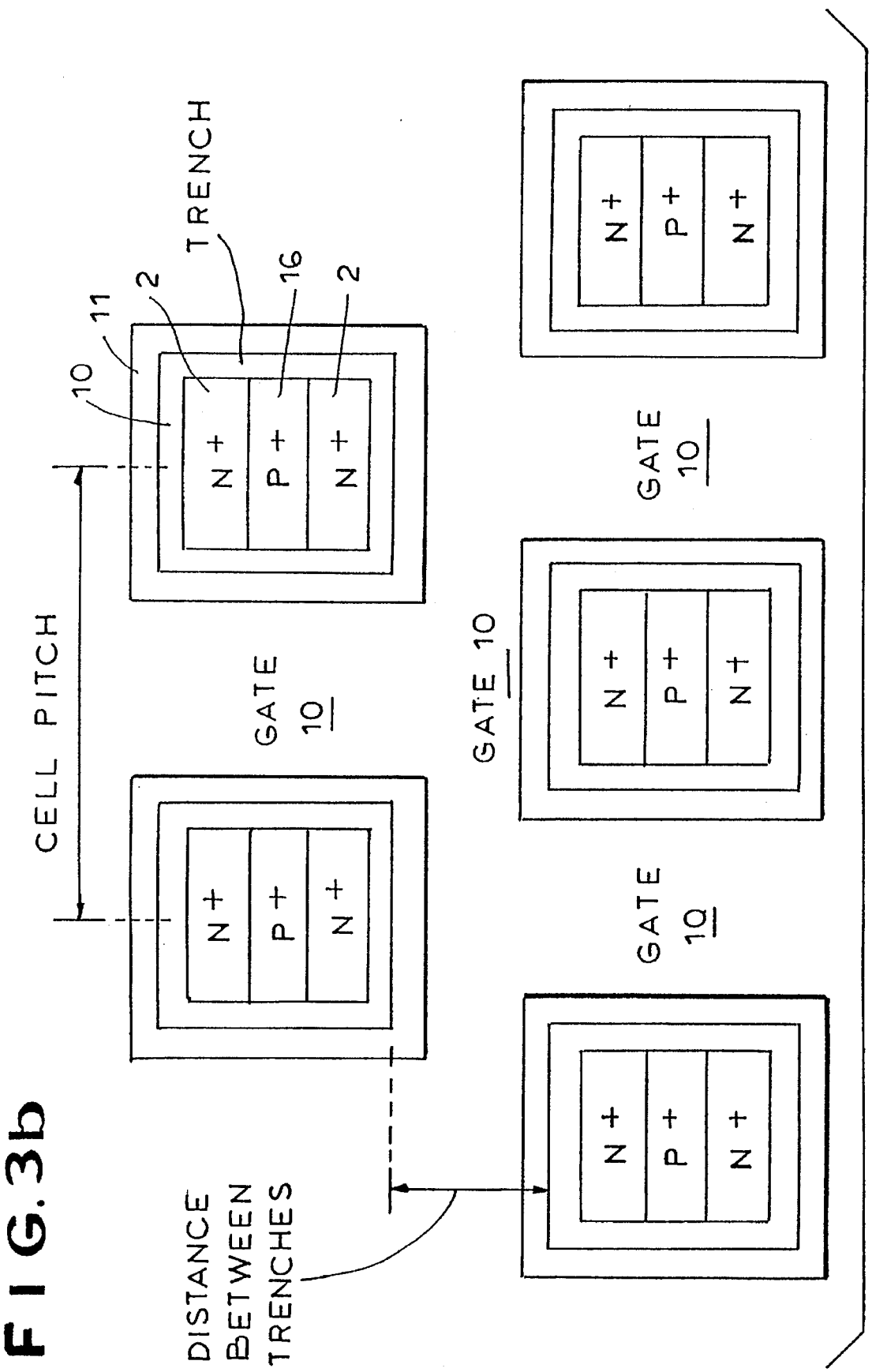

F I G. 10
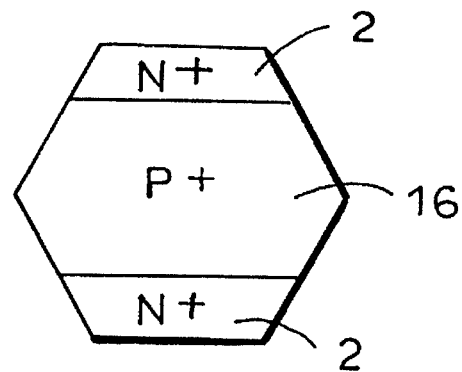
F I G. 11
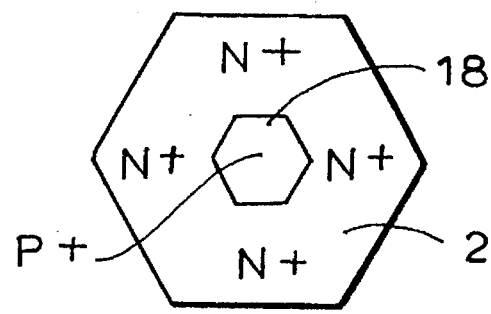
F I G. 12
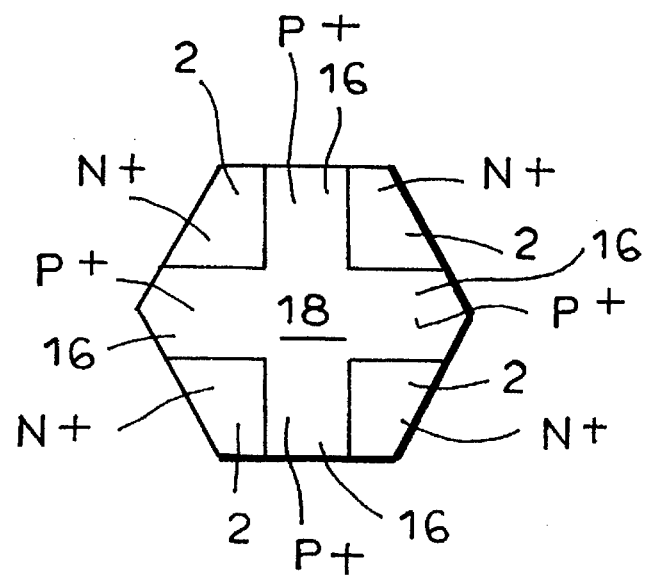

TRENCH DEPLETION MOSFET

BACKGROUND OF THE INVENTION

1. Field of the Invention

The present invention relates to high power MOSFET transistors and, more particularly, to high power MOSFET transistors with low on-resistance employing a trench MOS gate structure.

2. Description of the Related Art

To optimize the power-handling capability of any power semiconductor device, it is essential to maximize the cell packing density. It has become evident both experimentally and analytically that device physics limitations are restricting further advances in cell packing density, and thus in MOSFET performance, using a surface channel formed by the self-aligned double-diffused process, commonly known as DMOS.

An improvement in cell packing density can be achieved by utilizing a trench MOS gate structure rather than a standard DMOS structure. The lack of JFET pinching effect in a trench gate structure also results in a significantly lower on-state resistance compared with a DMOS structure. Low on-resistance is particularly important when MOSFETs are used in low-frequency power electronic applications, such as automotive electronics.

A conventional trench power MOSFET is shown in FIG. 1. The device includes an $N^+$ source region 2, a P base or channel region 4, an $N^-$ region 6 and an $N^+$ region 8. A polysilicon gate 10 is formed in trenches on both sides of P base 4 and separated therefrom by a thin layer of oxide 11. A source electrode 12 on the upper surface of the device covers source region 2. A drain electrode 14 on the bottom surface of the device covers $N^+$ region 8.

The operation of the device of FIG. 1 is as follows. With the drain electrode 14 positive with respect to the source electrode 12, current flows upward through the device when a positive potential is applied to gate 10. The positive potential on gate 10 inverts P base 4, forming an n-channel therethrough, permitting current to flow from drain to source.

While the trench power MOSFET of FIG. 1 has significant advantages over a DMOS transistor in terms of cell packing density, the inclusion of a P base in the structure undesirably contributes to on-resistance, because of channel resistance when the p-channel is inverted. This sets a limit on the amount that on-resistance can be reduced in a DMOS device. Additionally, the conventional trench power MOSFET shown in FIG. 1 has a parasitic P-N junction, which presents a problem during synchronous rectification.

An enhancement type of structure for a trench power MOSFET is shown in FIG. 2, wherein like elements are indicated by like reference numerals. This device, described by B. Baliga, "The Accumulation-Mode Field-Effect Transistor: A New Ultralow On-Resistance MOSFET," *IEEE Electron Device Letters*, Vol. 13, No. 8, August 1992, pp. 427–29), does not contain a P base region, and therefore has no P-N junction between the source and drain regions. Unlike the depletion type trench power MOSFET shown in FIG. 1, current conduction in the device of FIG. 2 occurs along the surface of an accumulation layer formed along the trench sidewalls, resulting in a much lower on-resistance. Additionally, in the device of FIG. 2, a drift region doping below $1\times 10^{14}$ $cm^{-3}$ can be used, while an optimal drift region doping of $2\times 10^{16}$ $cm^{-3}$ is required for the trench power MOSFET of FIG. 1. Further, the structure of FIG. 2 advantageously does not contain a parasitic P-N junction.

In order to turn off the device of FIG. 2, a potential is applied to gate 10 to invert the $N^-$ region 6. However, in the FIG. 2 device, the depletion width due to the MOS gate is limited by the formation of an inversion layer of holes in the $N^-$ drift region. This limits the forward blocking capability of the device.

SUMMARY OF THE INVENTION

The present invention is a trench power MOSFET with a unique structure which overcomes the above-noted deficiencies of the prior art.

Advantageously, the present invention, like the trench power MOSFET of FIG. 2, does not have a P base region and thus has no P-N junction. Thus, the trench power MOSFET of the present invention is formed in a wafer of semiconductor material having first and second (i.e. upper and lower) opposing semiconductor surfaces, the wafer of semiconductor material including a relatively lightly doped region of a first conductivity type, preferably $N^-$, a plurality of spaced narrow trenches perpendicularly formed in the wafer and extending from the upper surface of the wafer, at least a portion of the $N^-$ region being disposed between the trenches from the upper semiconductor surface. Polysilicon gates are disposed in the trenches and spaced from the intervening portion of the $N^-$ region by a layer of gate insulation material. A first relatively highly doped region of the first conductivity type, i.e. $N^+$, is disposed between and adjacent to the upper semiconductor surface and the $N^-$ region.

The present invention is an improvement over the prior art device of FIG. 2, however, by the inclusion, in a first embodiment, of a $P^+$ region formed in the wafer and extending from the upper surface of the wafer at a position adjacent to and at least partially co-extensive with the upper $N^+$ region, i.e. the source region. On application of a negative gate voltage to turn the device off, the added $P^+$ region forms a drain for holes generated in the $N^-$ region. Thus, as soon as the holes are formed, they are swept off towards the $P^+$ region by the electric field, via a trench p-channel MOSFET. This effect is hereinafter termed "deep-depletion."

The deep-depletion very efficiently pinches off the $N^-$ region between the trench MOS gates, forming a potential barrier to the flow of electrons and greatly improving the forward blocking capability of the device. Unlike the prior art structure of FIG. 2, the depletion width due to the MOS gate is not limited by the formation of an inversion layer of holes. This allows the trench gates in the structure of the present invention to be spaced farther apart, improves breakdown voltage, reduces leakage current and simplifies fabrication.

In the on-state, with a positive voltage on the gate, the current conduction, as in the prior art FIG. 2 device, is mainly through an accumulation layer formed on the silicon surface on the side of the trench. Since the effective mobility of the electrons in the accumulation region is higher than that through the inversion region, the on-resistance of the device of the present invention, like the prior art device of FIG. 2, is still lower than the conventional trench power MOSFET.

In a second embodiment of the invention, a $P^+$ diffusion is formed centrally within the $N^+$ region between the gates. The $P^+$ diffusion causes pinch-off of the portion of the $N^-$ region between the P+ diffusion and the MOS gate (i.e. a JFET action) with a negative potential applied to the gate.

In yet another embodiment of the invention, a P+ region is formed both at the upper surface of the device, spaced from the N+ source (as in the first embodiment), and formed centrally within the N+ region between the gates (as in the second embodiment of the invention).

The present invention further preferably includes an N+ region between and adjacent to the lower semiconductor surface and the N− region (in a MOSFET embodiment) or a P+ region between and adjacent to the lower semiconductor surface of the device and the N− region, thereby forming a structure consisting of a PN diode in series with a trench MOSFET (i.e. an IGBT embodiment).

Advantageously, all embodiments of the invention can be implemented in a cellular geometry with ring shaped trenches spaced from one another over the surface of the silicon. Additionally, in all embodiments, the overlap between the N− region and the gate can be varied to optimize either breakdown voltage or on-resistance performance of the device.

The present invention may also be provided in a horizontal conduction configuration, in which case the gate is disposed on the upper surface of the device over the N− drift region, rather than in trenches.

Other features and advantages of the present invention will become apparent from the following description of the invention which refers to the accompanying drawings.

BRIEF DESCRIPTION OF THE DRAWINGS

FIG. 3b shows a top view of multiple cells of the first embodiment of the present invention.

FIGS. 10, 11 and 12 show a top view of a preferred hexagonal cell configuration for the embodiments of FIGS. 3, 4 and 5, respectively.

DETAILED DESCRIPTION OF THE PREFERRED EMBODIMENTS

Figure 1:
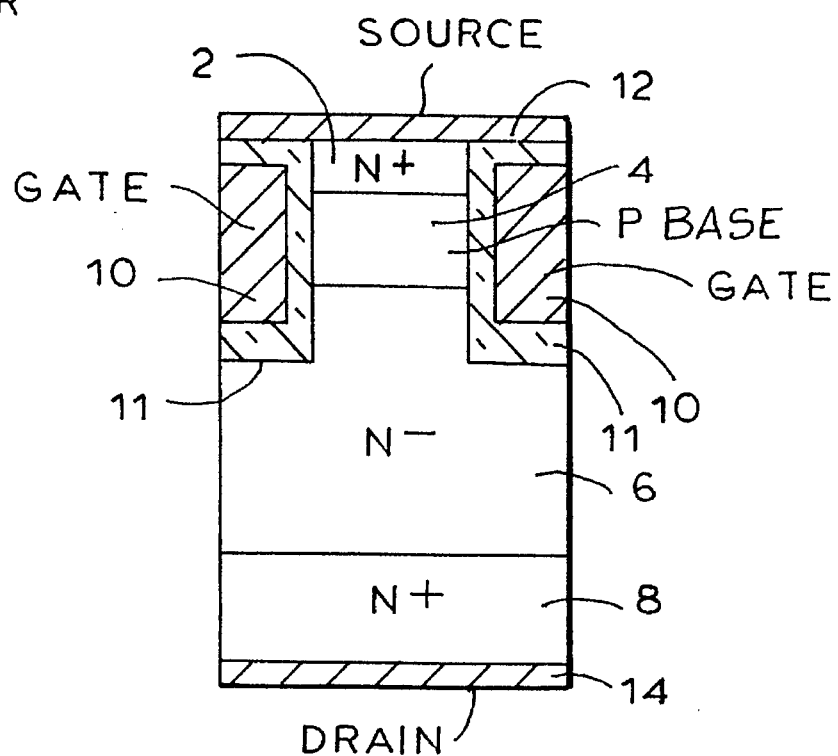
FIG. 1 shows the configuration of a prior art depletion type trench power MOSFET.
Figure 2:
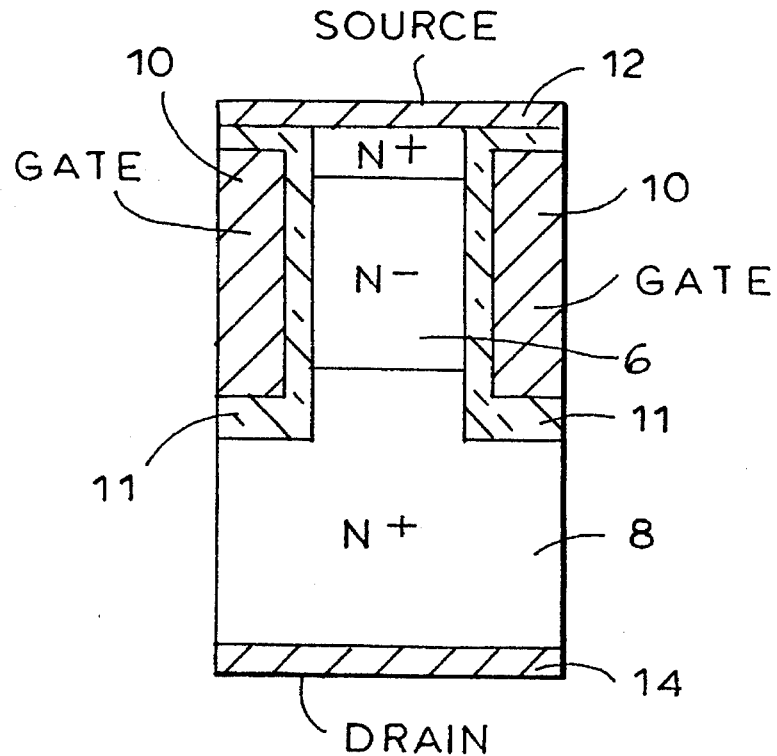
FIG. 2 shows the configuration of a prior art enhancement type trench power MOSFET.
Figure 3:
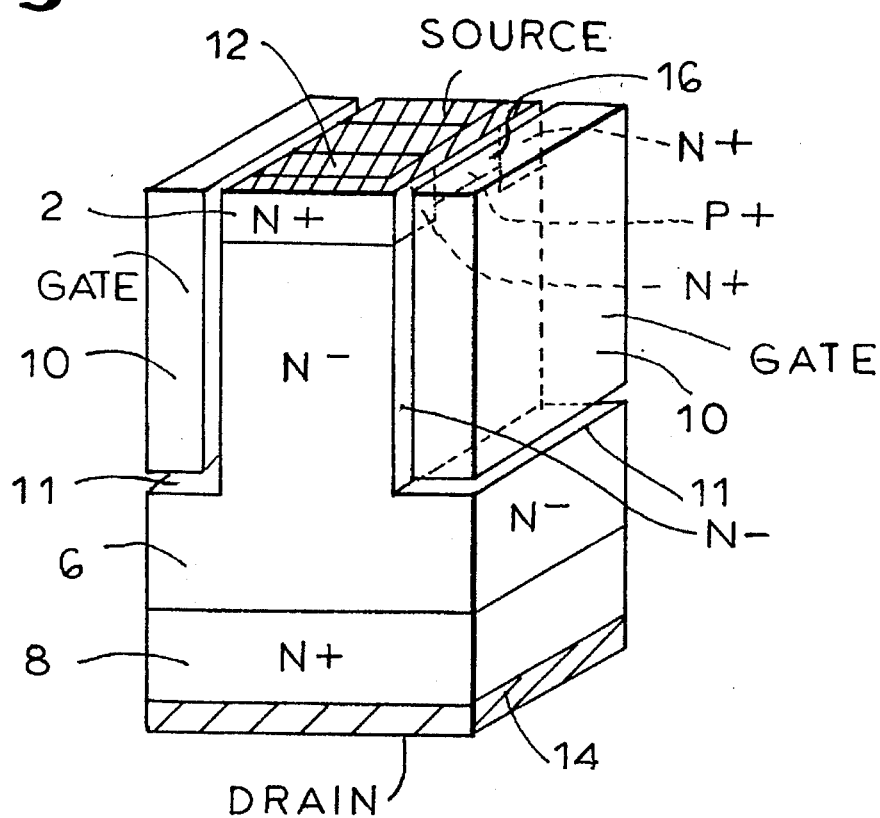
FIG. 3 shows a first embodiment of the present invention within added P+ drain region extending from the upper surface of the enhancement type device.

A first embodiment of the novel trench power MOSFET of the present invention is shown in FIG. 3. As shown therein, the present invention has a structure similar to the prior art device of FIG. 2, but additionally includes a P+ region 16 formed in the wafer and extending from the upper surface of the wafer (covered by source electrode 12) adjacent to N+ source region 2.

As shown by the arrow in FIG. 3, when the device is in the off (forward blocking state), with a negative potential applied to gate 10, P+ region 16 advantageously sweeps off holes formed in N− region 6 via a trench p-channel MOSFET in which P+ region 16 acts as the "drain" gate electrode 10 is the "gate", N− region 6 is the "channel" (inverted by the gate) and the holes formed by the inversion of N− region 6 are the "source". P+ region 16 thus acts as a drain for the holes, resulting in the following advantages:

First, P+ drain region 16 prevents the formation of an inversion layer of holes when the device is in the off-state and thus overcomes a primary limitation on the performance of the prior art FIG. 2 device, namely a limitation on the depletion depth adjacent the gate. Thus, P+ drain region 16 of the present invention causes increased depletion ("deep-depletion") adjacent the gate in the off-state. This increases the potential barrier for the flow of electrons between source 12 and drain 14 in the off-state, which leads to reduced leakage current and higher breakdown voltage.

Second, the elimination of an inversion layer of holes in the present invention eliminates band-to-band tunneling leakage current, which is a significant leakage mechanism in VLSI devices, including the FIG. 2 device.

The embodiment of the present invention shown in FIG. 3 was simulated with the parameters shown in the following Table:

| PARAMETER | VALUE |
| --- | --- |
| Cell pitch (see FIG. 3b) | 3 μm |
| N− drift region doping | $1 \times 10^{14}$ cm$^{-3}$ |
| Trench depth | 4 μm |
| Trench width | 2 μm |
| Distance between trenches (see FIG. 3b) | 1 μm |
| Gate oxide thickness | 500 Å |
| Source metal contact window | 0.8 μm |
| P+ surface concentration | $1 \times 10^{20}$ cm$^{-3}$ |
| P+ junction depth | 0.3 μm |
| N+ source surface concentration | $1 \times 10^{18}$ cm$^{-3}$ |
| N+ source juction depth | 0.7 μm |

The results of the simulation using the foregoing parameters showed a forward blocking voltage in excess of 60 V. The on-resistance $R_{ON}$ was found to be 0.076 mΩ-cm$^2$, which is significantly lower than the on-resistance of conventional trench power MOSFETs. Fully gate controlled characteristics and a threshold voltage of 0.8 V was obtained. Theoretical calculations of $R^{ON}$ using the various components of on-resistance agree closely with these results.

Figure 4:
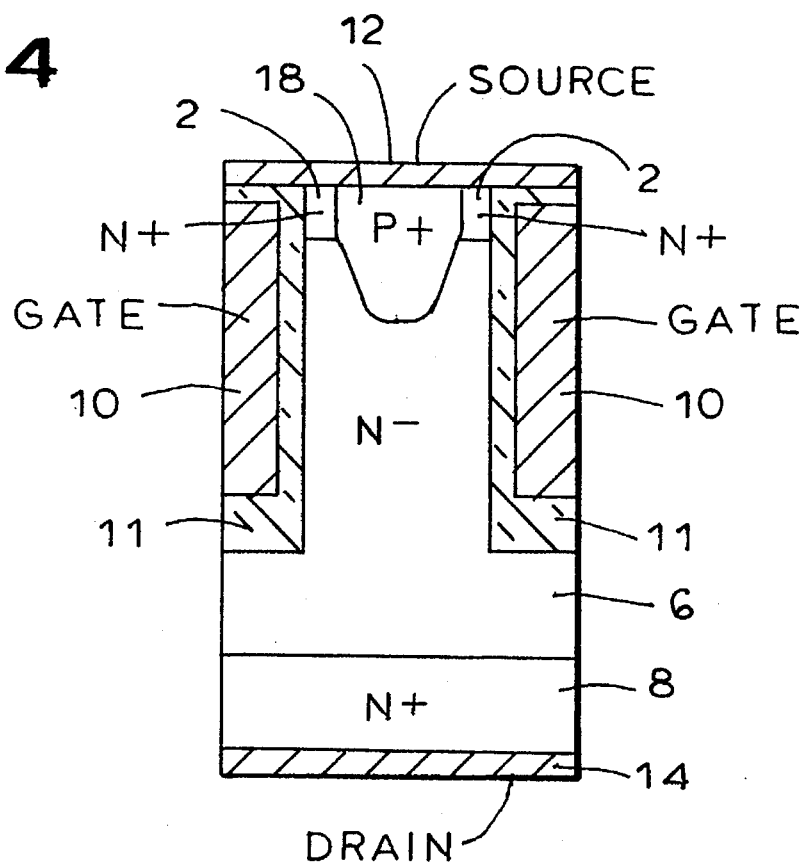
FIG. 4 shows a second embodiment of the present invention with a P+ region diffused from the upper surface of the wafer centrally through the N+ source region and into the N− drift region between the trench gates.

Referring now to FIG. 4, a second embodiment of the present invention is shown in which a P+ region 18 is diffused from the upper surface of the wafer centrally through N+ source region 2 and into N− drift region 6. Forward blocking in this embodiment is achieved by depletion from MOS gate 10 and a junction depletion (JFET action) from P+ diffusion 18.

Figure 5:
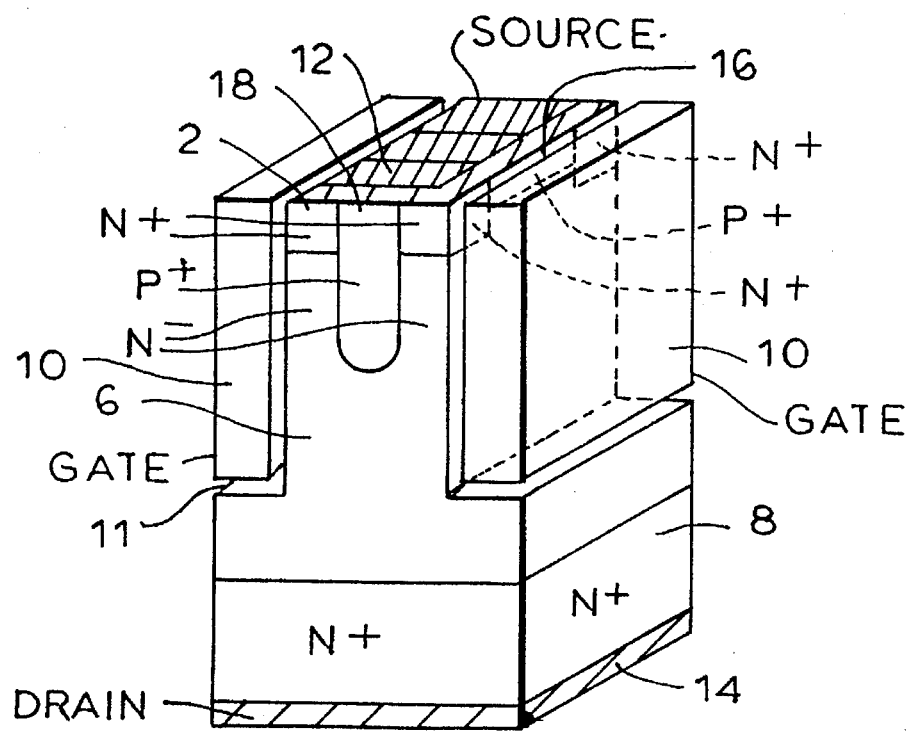
FIG. 5 shows a combined embodiment of the invention provided with the P+ regions of both FIG. 3 and FIG. 4.
Figure 5A:
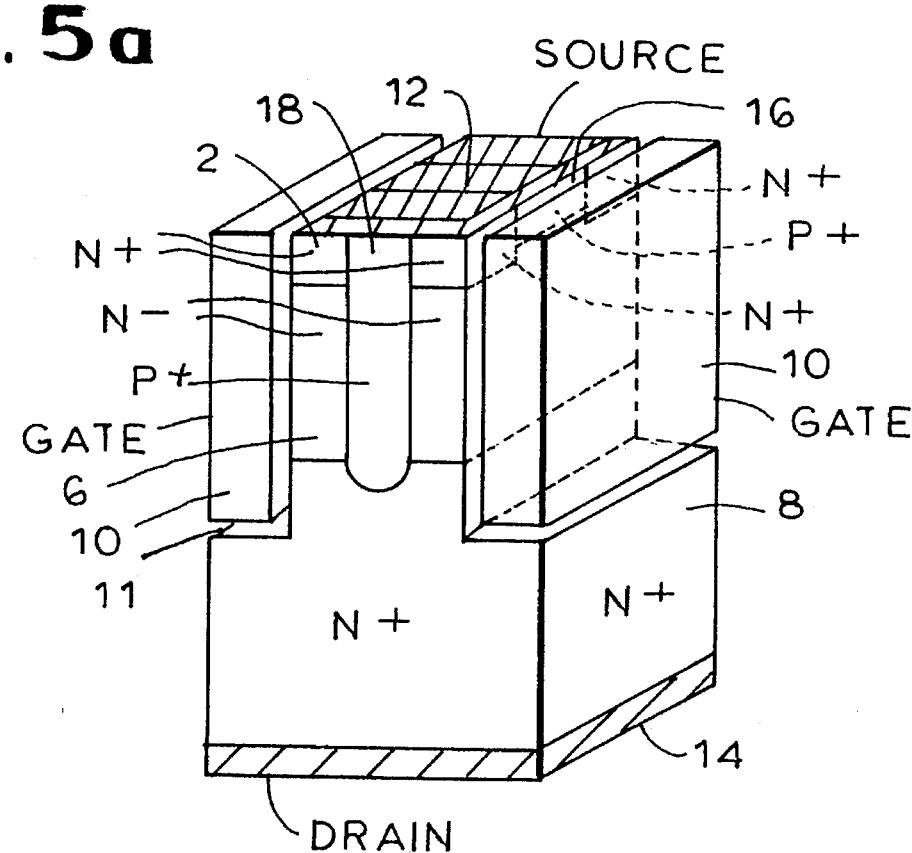
FIG. 5a shows alternative configuration of FIG. 5 with the central P+ region extending all the way to the N+ drain region.

Optionally, as shown in FIG. 5, the present invention can be provided in an embodiment with both P+ drain region 16 and P+ diffusion 18, and with the accompanying advantages of each. FIG. 5a shows an alternative configuration of FIG. 5 with the central P+ region 18 extending all the way down to the N+ region 8.

Figure 6:
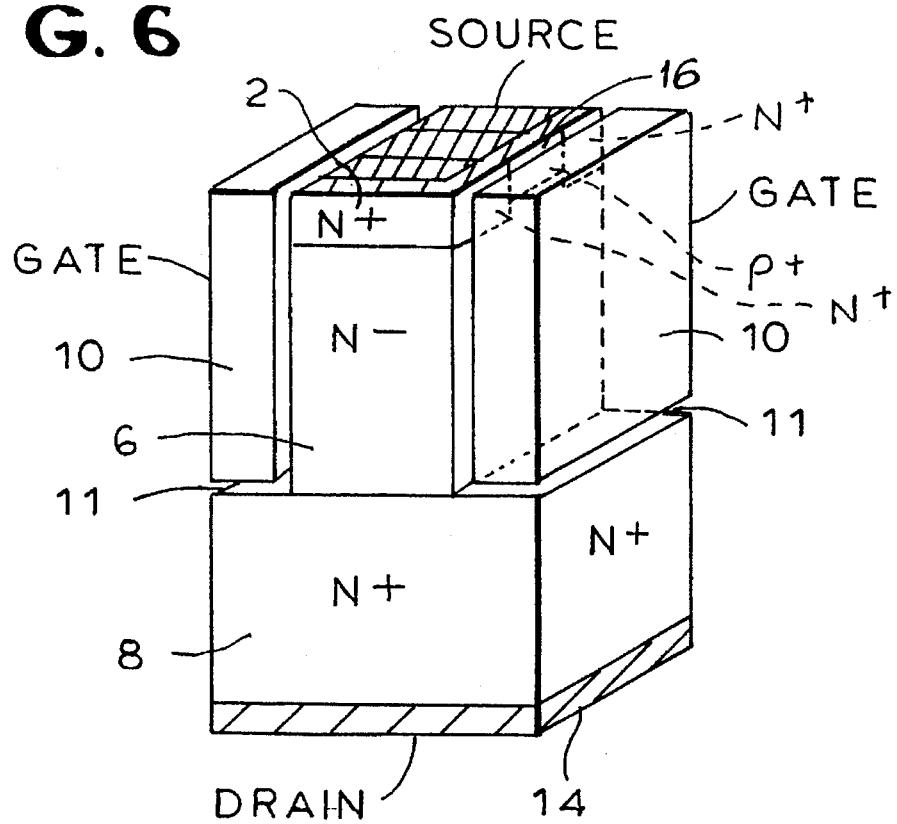
FIGS. 6 and 7 show an alternative configuration corresponding to the embodiments of FIGS. 3 and 4, respectively, which has a shallower N− drift region and thus a lower on-resistance, but also a lower breakdown voltage.
Figure 7:
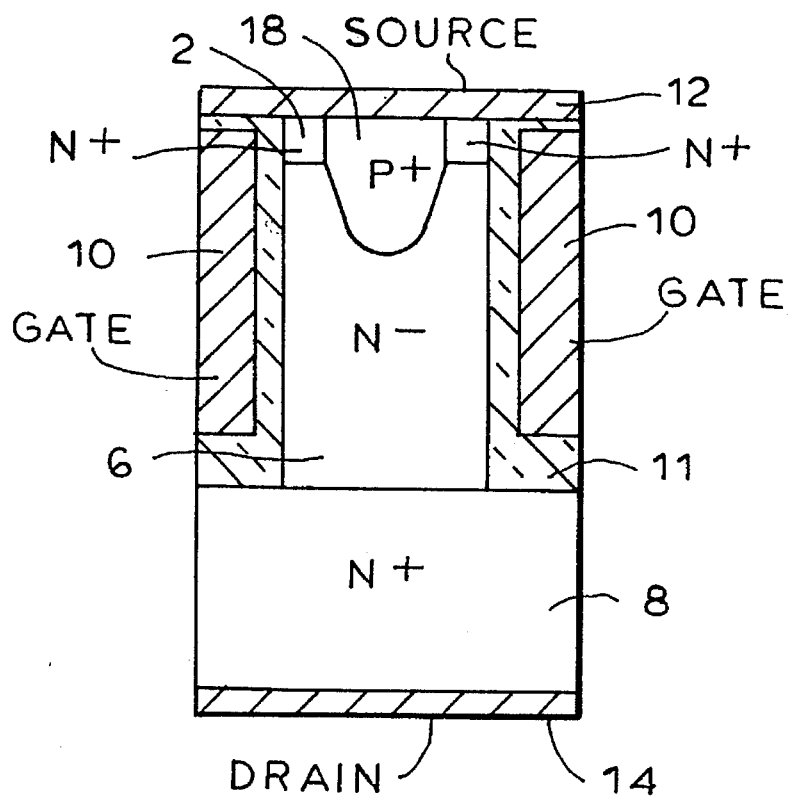
Figure 8:
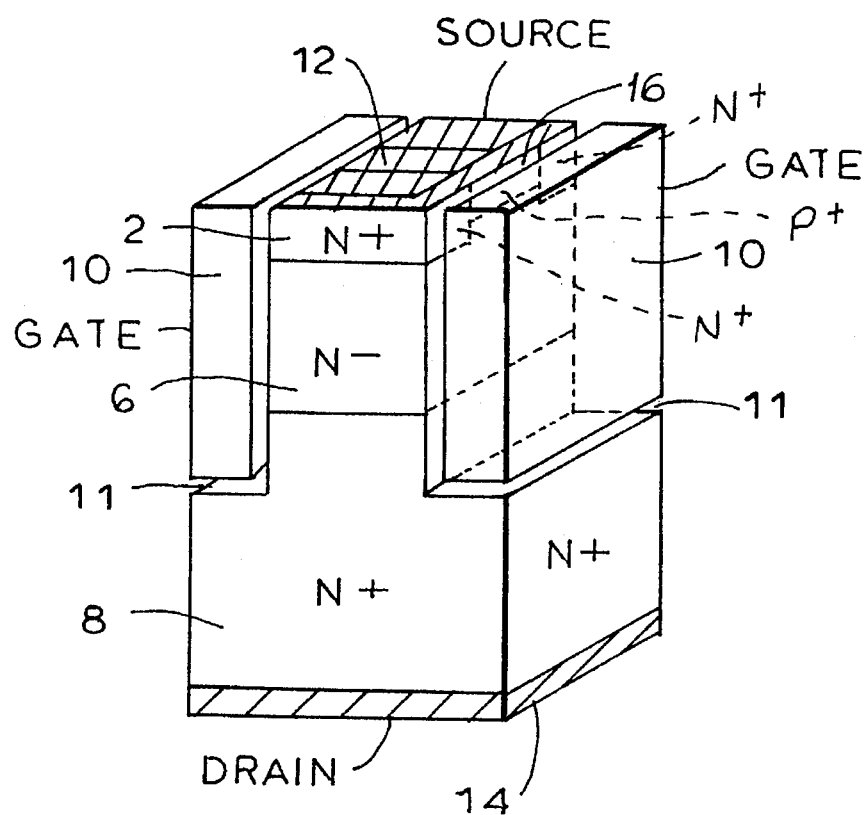
FIGS. 8 and 9 show another alternative configuration corresponding again to the embodiments of FIGS. 3 and 4, respectively, with an even shallower N− drift region than the embodiment of FIGS. 6 and 7.
Figure 9:
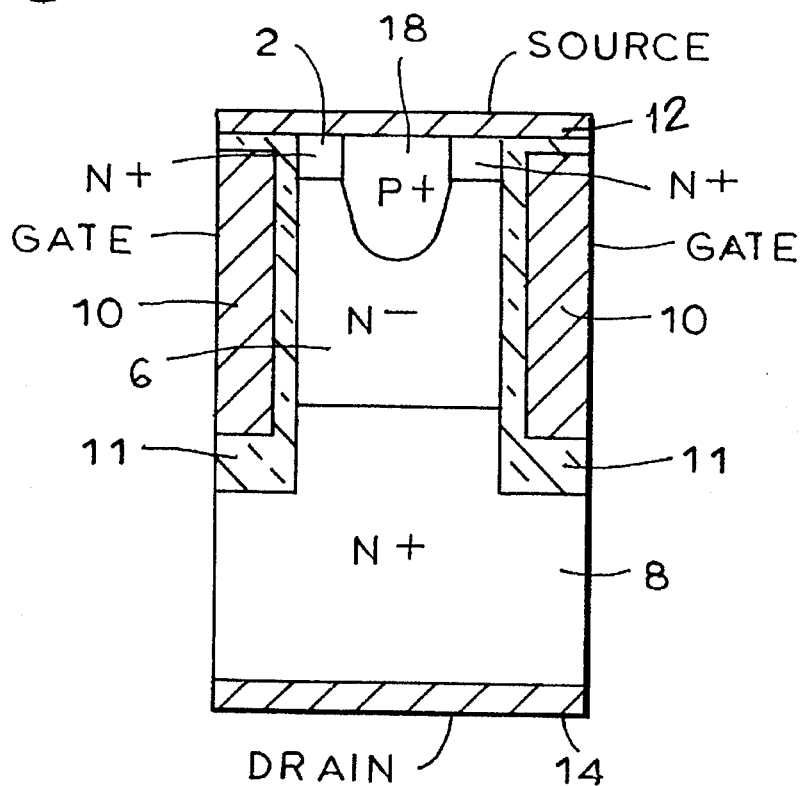

FIGS. 6 and 7 show an alternative configuration corresponding to the embodiments of FIGS. 3 and 4, respectively, which has a shallower N− drift region 6 and thus a lower on-resistance, but also a lower breakdown voltage. FIGS. 8 and 9 show another alternative configuration again corresponding to the embodiments of FIGS. 3 and 4, respectively, with an even shallower N− drift region 6 than the embodiment of FIGS. 6 and 7. The embodiment of FIGS. 8 and 9 has the lowest on-resistance, but can only be used in low voltage applications due to its relatively low breakdown voltage.

Figure 3A:
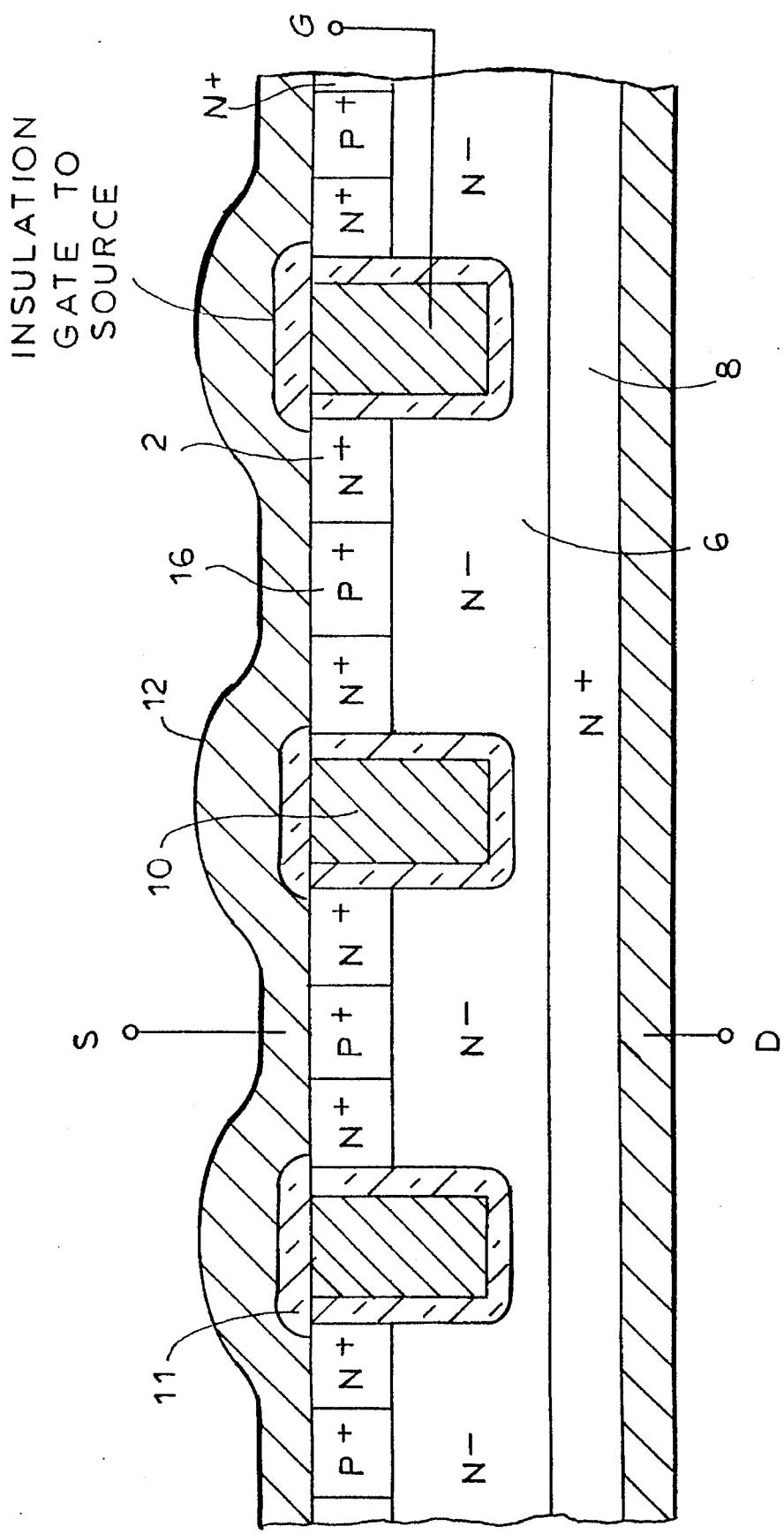
FIG. 3a shows a cross-section of multiple cells of the first embodiment of the present invention.

Advantageously, the present invention can be provided in a cellular topology. For example, FIGS. 3a and 3b show a cross-section and top view, respectively, of multiple cells of the embodiment of FIG. 3. Alternatively and preferably, each of the unit cells can be provided in a polygonal configuration. FIGS. 10, 11 and 12 show the top view of a preferred hexagonal cell configuration for the embodiments of FIGS. 3, 4 and 5, respectively.

Figure 13:
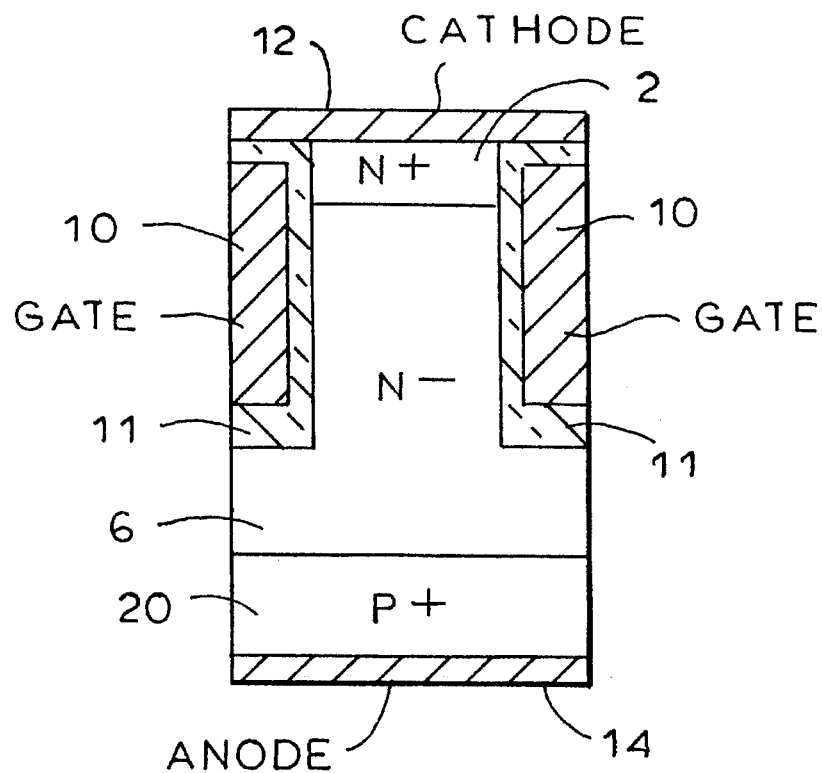
FIGS. 13–15 show yet an IGBT embodiment of the invention in which the N+ region at the lower surface of the device is replaced by a P+ region.
Figure 14:
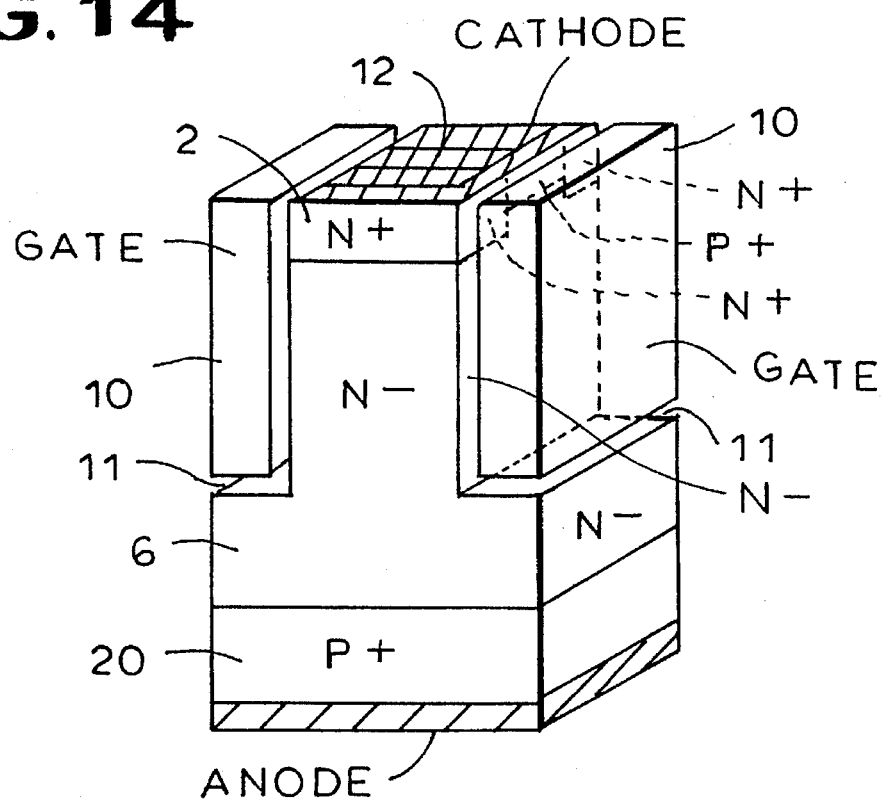
Figure 15:
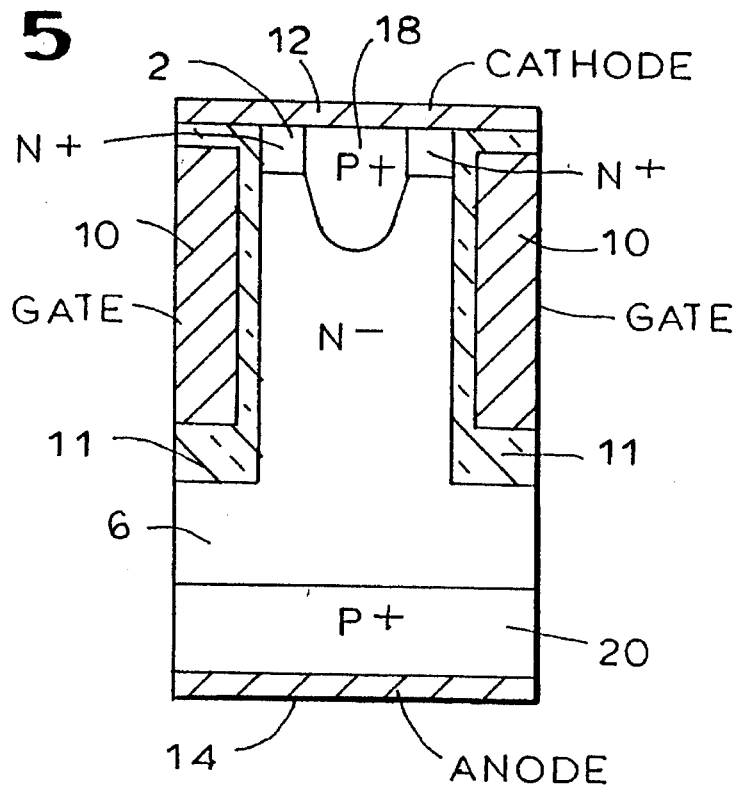

FIGS. 13–15 show yet another embodiment of the invention in which N+ region 8 is replaced by a P+ region 20. Thus, as shown in FIG. 13, the prior art FIG. 2 structure can be modified to form a PN junction in series with a trench transistor, thereby creating an IGBT device. Likewise, FIGS. 14 and 15 show the IGBT configuration corresponding to the embodiments of FIGS. 3 and 4, respectively.

Although not shown, the combined embodiment of the invention shown in FIG. 5 can be similarly provided in an IGBT configuration. Likewise, the IGBT configurations can be implemented in a cellular topology (corresponding to FIGS. 10–12) and/or with the shallower N− drift regions 6 shown in FIGS. 6–9 to improve on-resistance in lower voltage applications.

Figure 16:
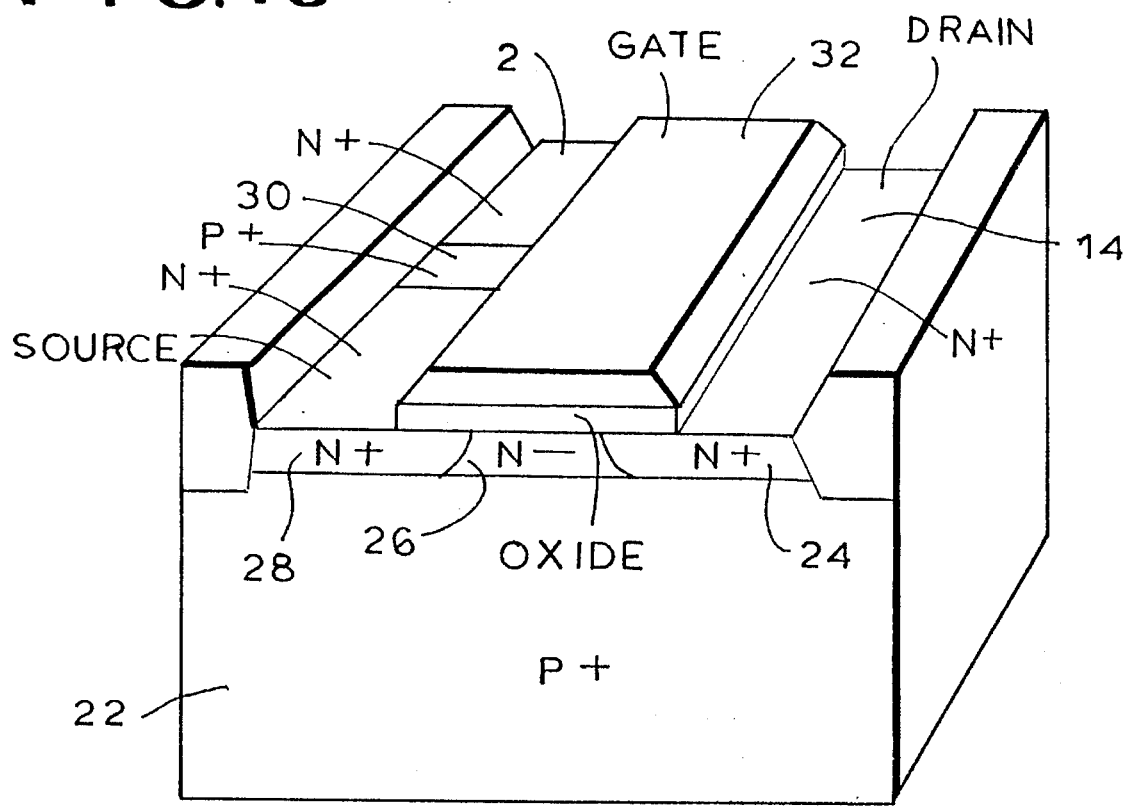
FIG. 16 shows a horizontal conduction embodiment of the invention.

FIG. 16 shows a horizontal conduction embodiment of the invention in which the device is formed on a P+ substrate 22. In the on-state, current flows from N+ drain region 24, through N− drift region 26 to N+ source region 28. As in the corresponding vertical conduction embodiment of FIG. 3, a P+ drain region 30 is formed in the semiconductor wafer and extends into the wafer from the upper surface thereof at a position adjacent to the N+ source region 28. A MOS gate 32 overlies N− drift region 26.

On application of a negative voltage to MOS gate 32, P+ region 30 forms a drain for holes generated in N− drift region 26. Thus, again, as soon as the holes are formed, they are swept off towards P+ region 30 by the electric field, via a lateral p-channel MOSFET, resulting in "deep-depletion" of N− drift region 26.

Obviously, many other variations of the present invention are possible. For example, in all of the previously described embodiments, the doping polarities of the regions and applied voltages could be reversed, such that current would flow in the opposite direction.

Thus, although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high power metal oxide semiconductor field effect trench transistor device exhibiting relatively low on-resistance and relatively high breakdown voltage, said device comprising:

a wafer of semiconductor material having first and second opposing semiconductor surfaces, said wafer of semiconductor material including a relatively lightly doped region of a first conductivity type, a plurality of spaced narrow trenches perpendicularly formed in said wafer and extending from said first semiconductor surface, at least a portion of said relatively lightly doped region being disposed between said trenches;

gate electrode means disposed in said trenches and spaced from said portion of said relatively lightly doped region by a layer of gate insulation material;

a first relatively highly doped region of said first conductivity type disposed between and adjacent to said first semiconductor surface and said relatively lightly doped region; and a first region of a second conductivity type opposite to said first conductivity type, said first region of said second conductivity type being formed in said wafer and extending from said first semiconductor surface adjacent, in a first planar direction, to said first relatively highly doped region of said first conductivity type and directly contacting, in a second planar direction orthogonal to said first planar direction, to said gate insulation material, thereby forming a MOSFET of said second conductivity type, said first region of said second conductivity type comprising a drain region of said MOSFET of said second conductivity type and forming a drain for carriers of said second conductivity type generated in said portion of said relatively lightly doped region of said first conductivity type between said gates to create a deep-depletion region therein and provide enhanced forward blocking capability for the device when a voltage is applied to said gate electrode means to turn off the device.

2. The device of claim 1, further comprising a second region of said second conductivity type opposite to said first conductivity type formed in said wafer between said trenches and extending from said first semiconductor surface through said first relatively highly doped region of said first conductivity type and through at least a part of said relatively lightly doped region of said first conductivity type, said second region of said second conductivity type being spaced from said trenches on opposite sides thereof by said first relatively highly doped region of said first conductivity type and by said part of said relatively lightly doped region of said first conductivity type through which said second region of said second conductivity type extends;

whereby, when said voltage is applied to said gate electrode means to turn off the device, carriers of said first conductivity type in said portion of said relatively lightly doped region of said first conductivity type between said gates are depleted from said relatively lightly doped region of said first conductivity type between said gate electrode means by action of gate depletion and junction depletion to further enhance the forward blocking capability for the device.

3. The device of claim 2, wherein said relatively lightly doped region of said first conductivity type extends beneath and laterally under said trenches.

4. The device of claim 2, further comprising a second relatively highly doped region of said first conductivity type disposed between and adjacent to said second semiconductor surface and said relatively lightly doped region of said first conductivity type.

5. The device of claim 4, wherein said second relatively highly doped region of said first conductivity type extends upwardly from said second semiconductor surface and between said trenches.

6. The device of claim 2, further comprising a third region of said second conductivity type disposed between and adjacent to said second semiconductor surface and said relatively lightly doped region of said first conductivity type.

7. The device of claim 2, wherein said first conductivity type comprises N-type and said second conductivity type comprises P-type.

8. The device of claim 2, wherein said gate electrode means comprises a polysilicon gate.

9. The device of claim 2, wherein said device is provided in a cellular topology comprising a plurality of parallel-connected identical polygonal cells.

10. The device of claim 1, wherein said relatively lightly doped region of said first conductivity type extends beneath and laterally under said trenches.

11. The device of claim 1, further comprising a second relatively highly doped region of said first conductivity type disposed between and adjacent to said second semiconductor surface and said relatively lightly doped region of said first conductivity type.

12. The device of claim 1, wherein said second relatively highly doped region of said first conductivity type extends upwardly from said second semiconductor surface and between said trenches.

13. The device of claim 1, further comprising a first relatively highly doped region of said second conductivity type disposed between and adjacent to said second semiconductor surface and said relatively lightly doped region of said first conductivity type.

14. The device of claim 1, wherein said first conductivity type comprises N-type and said second conductivity type comprises P-type.

15. The device of claim 1, wherein said gate electrode means comprises a polysilicon gate.

16. The device of claim 1, wherein said device is provided in a cellular topology comprising a plurality of parallel-connected identical cells.

17. The device of claim 16, wherein each of said plurality of parallel-connected identical cells has a polygonal shape.

18. A high power metal oxide semiconductor field effect transistor device exhibiting relatively low on-resistance and relatively high breakdown voltage, said device comprising:

a wafer of semiconductor material having first and second opposing semiconductor surfaces;

a relatively lightly doped region of a first conductivity type formed in said wafer and extending from said first semiconductor surface to a substrate portion of said wafer, said substrate portion comprising a region of a second conductivity type;

gate insulation means on said first semiconductor surface and disposed at least on said relatively lightly doped region of said first conductivity type;

gate electrode means disposed over said gate insulation means;

a relatively highly doped drain region of said first conductivity type formed in said wafer and extending from said first semiconductor surface to said substrate portion of said wafer, said drain region being disposed laterally and adjacent to said relatively lightly doped region of said first conductivity type on a first side thereof;

a relatively highly doped source region of said first conductivity type formed in said wafer and extending from said first semiconductor surface to said substrate portion of said wafer, said source region being disposed laterally and adjacent to said relatively lightly doped region of said first conductivity type on a second side thereof opposite to said first side;

a first region of said second conductivity type opposite to said first conductivity type, said first region of said second conductivity type being formed in said wafer and extending from said first semiconductor surface adjacent to said relatively highly doped source region of said first conductivity type;

whereby, when a voltage is applied to said gate electrode means to turn off the device, said first region of said second conductivity type forms a drain for carriers of said second conductivity type generated in said relatively lightly doped region of said first conductivity type under said gate electrode means to create a deep-depletion region therein and provide enhanced forward blocking capability for the device.

19. The device of claim 18, wherein said first conductivity type comprises N-type and said second conductivity type comprises P-type.

20. The device of claim 18, wherein said gate electrode means comprises a polysilicon gate.

* * * * *